(12) United States Patent
Song et al.

(10) Patent No.: US 9,645,201 B2
(45) Date of Patent: May 9, 2017

(54) VOLTAGE MEASURING APPARATUS AND BATTERY MANAGEMENT SYSTEM INCLUDING THE SAME

(71) Applicant: FAIRCHILD KOREA SEMICONDUCTOR LTD., Bucheon-si (KR)

(72) Inventors: Moonsik Song, Bucheon-si (KR); Seok Heo, Incheon (KR)

(73) Assignee: Fairchild Korea Semiconductor LTD (KR)

( * ) Notice: Subject to any disclaimer, the term of this patent is extended or adjusted under 35 U.S.C. 154(b) by 268 days.

(21) Appl. No.: 14/189,212

(22) Filed: Feb. 25, 2014

(65) Prior Publication Data

US 2014/0239966 A1 Aug. 28, 2014

(30) Foreign Application Priority Data

Feb. 25, 2013 (KR) .................. 10-2013-0020100

(51) Int. Cl.
 *H02J 7/00* (2006.01)
 *H02J 7/14* (2006.01)
 *G01R 31/36* (2006.01)

(52) U.S. Cl.
 CPC ........ *G01R 31/3658* (2013.01); *H02J 7/0021* (2013.01); *H02J 7/0016* (2013.01); *H02J 7/0047* (2013.01)

(58) Field of Classification Search
 USPC ....... 320/116, 118, 120, 136, 108, 128, 130, 320/132, 133, 137, 140, 149, 150; 324/433, 434, 429
 See application file for complete search history.

(56) References Cited

U.S. PATENT DOCUMENTS

| | | | | |
|---|---|---|---|---|
| 5,206,578 A | * | 4/1993 | Nor .................... | G01R 31/3658 320/118 |
| 5,677,077 A | * | 10/1997 | Faulk .................... | H02J 7/0021 324/433 |
| 5,889,385 A | * | 3/1999 | Podrazhansky ....... | H02J 7/0016 320/130 |
| 7,952,419 B1 | | 5/2011 | Birk | |
| 7,973,534 B2 | * | 7/2011 | Tatebayashi .......... | H02J 7/0026 320/116 |
| 2004/0051534 A1 | * | 3/2004 | Kobayashi ......... | G01R 31/3658 324/429 |

(Continued)

*Primary Examiner* — Alexis A Boateng
(74) *Attorney, Agent, or Firm* — Grossman Tucker Perreault & Pfleger PLLC (57) ABSTRACT

The voltage measuring apparatus is connected to a plurality of battery cells connected to each other in series to measure respective voltages of the battery cells. The voltage measuring apparatus includes a sample/hold amplifier configured to sample and hold positive electrode and negative electrode voltages of the battery cells to generate first and second output voltages, a differential voltage converter configured to generate a battery cell voltage according to a voltage difference between a positive input terminal and a negative input terminal, and a switching unit configured to control the first and second output voltages and connection between the positive input terminal and the negative input terminal so that a polarity of the voltage difference is constant. The sample/hold amplifier electrically insulates the switching unit from the battery cells.

15 Claims, 3 Drawing Sheets

(56) References Cited

U.S. PATENT DOCUMENTS

| | | | |
|---|---|---|---|
| 2007/0202371 A1* | 8/2007 | Takeda | G01R 31/3658 429/432 |
| 2007/0285083 A1* | 12/2007 | Kamata | G01R 31/362 324/120 |
| 2008/0238432 A1* | 10/2008 | Botker | G01R 31/3658 324/434 |
| 2008/0309317 A1* | 12/2008 | Chen | G01R 19/0084 324/72 |
| 2014/0043032 A1* | 2/2014 | Makino | H03K 17/6871 324/434 |
| 2014/0152261 A1* | 6/2014 | Yamauchi | B60L 11/1866 320/118 |

* cited by examiner

VOLTAGE MEASURING APPARATUS AND BATTERY MANAGEMENT SYSTEM INCLUDING THE SAME

CROSS-REFERENCE TO RELATED APPLICATION

This application claims priority to and the benefit of Korean Patent Application No. 10-2013-0020100 filed in the Korean Intellectual Property Office on Feb. 25, 2013, the entire contents of which are incorporated herein by reference.

BACKGROUND (a) Field

An exemplary embodiment relates to a voltage measuring apparatus and a battery management system including the same.

(b) Description of the Related Art

A voltage measuring apparatus according to the related art for measuring a plurality of battery cell voltages includes a switching unit for changing a polarity of a voltage received from a battery cell. The voltage measuring apparatus according to the related art includes a capacitor for storing voltages received from a plurality of battery cells.

When a plurality of battery cells are sequentially connected to the capacitor, a polarity of the voltage stored in the capacitor is alternately changed. The switching unit for changing the polarity of the voltage stored in the capacitor is sequentially and directly connected to the battery cells, respectively.

However, at least two of the battery cells have high voltages across the battery cell, respectively. As illustrated above, since the switching unit is directly connected to the battery cells, the switching unit must be configured by high voltage switching elements.

The high voltage switching elements have a larger size or a higher cost as compared with other type switching elements. Accordingly, the size and the cost of the voltage measuring apparatus are increased.

The above information disclosed in this Background section is only for enhancement of understanding of the background of the invention and therefore it may contain information that does not form the prior art that is already known in this country to a person of ordinary skill in the art.

SUMMARY

An exemplary embodiment has been made in an effort to provide a voltage measuring apparatus and a battery management system including the same having advantages of reducing a size and a cost.

A voltage measuring apparatus according to an exemplary embodiment is connected to a plurality of battery cells connected to each other in series to measure respective voltages of the battery cells.

The voltage measuring apparatus includes a sample/hold amplifier configured to sample and hold positive electrode and negative electrode voltages of the battery cells to generate first and second output voltages; a differential voltage converter configured to generate a battery cell voltage according to a voltage difference between a positive input terminal and a negative input terminal; and a switching unit configured to control the first and second output voltages and connection between the positive input terminal and the negative input terminal so that a polarity of the voltage difference is constant. The sample/hold amplifier may electrically insulate the switching unit from the battery cells.

The sample/hold amplifier may hold an input of a first input terminal in a first output node to generate the first output voltage, and hold an input of a second input terminal in a second output node to generate the second output voltage. The input of the first input terminal may be a voltage obtained by sampling a voltage at one of a positive electrode and a negative electrode of a first battery cell among the battery cells. The input of the second input terminal may be a voltage obtained by sampling a voltage at a remaining one of the positive electrode and the negative electrode of the first battery cell.

When the input of the first input terminal is a voltage obtained by sampling a positive electrode voltage of the first battery cell and the input of the second input terminal is a voltage obtained by sampling a negative electrode voltage of the first battery cell, the switching unit may couple the positive input terminal to the first output node and the negative input terminal to the second output node.

When the input of the first input terminal is a voltage by sampling a negative electrode of the first battery cell, and the input of the second input terminal is a voltage obtained by sampling a positive electrode voltage of the first battery cell, the switching unit may couple the positive input terminal to the second output node and to couple the negative input terminal to the first output node.

The voltage measuring apparatus may further include a first multiplexer including a first switch coupled the positive electrode of the first battery cell; and a second multiplexer including a second switch coupled the negative electrode of the first battery cell.

The first switch may be coupled a negative electrode of a second battery cell of the battery cells close to the positive electrode of the first battery cell.

The second switch may be coupled a positive electrode of a third battery cell of the battery cells close to the negative electrode of the first battery cell.

The sample/hold amplifier may include a first sampling capacitor including one electrode coupled to the first node; a second sampling capacitor including one electrode coupled to the second node; an operational amplifier including a first input terminal coupled to another electrode of the first sampling capacitor, a second input terminal coupled to another electrode of the second sampling capacitor, a first output node to which the first output voltage is applied, and a second output node to which the second output voltage is applied; a first holding capacitor and a first sample/hold switch coupled between the first input terminal and the first output node; a second holding capacitor and a second sample/hold switch coupled between the second input terminal and the second output node; and a third sample/hold switch coupled between the first node and the second node.

The first node and the second node may be coupled to a corresponding one of a positive electrode and a negative electrode of the first battery among the battery cells.

During a first period when the operational amplifier serves as a voltage follower, voltages may be sampled in the first sampling capacitor and the second sampling capacitor, respectively, and the operational amplifier amplifies a voltage difference between the first input terminal and the second input terminal after the first period.

When the first node is coupled to the positive electrode of the first battery cell, and the second node is coupled to the negative electrode of the first battery cell, during an on period of the first sample/hold switch and the second sample/hold switch, the first sampling capacitor may sample a positive electrode voltage of the first battery cell, and the second sampling capacitor may sample a negative electrode voltage of the first battery cell. The first sample/hold switch and the second sample/hold switch may be turned-off, during an on period of the third sample/hold switch, a voltage sampled in the first sampling capacitor may be held as the first output voltage by the first holding capacitor, and a voltage sampled in the second sampling capacitor may be held as the second output voltage by the second holding capacitor.

When the first node is coupled to the negative electrode of the first battery cell, and the second node is coupled to the positive electrode of the first battery cell, during an on period of the first sample/hold switch and the second sample/hold switch, the first sampling capacitor may sample a negative electrode voltage of the first battery cell, and the second sampling capacitor samples a positive electrode voltage of the first battery cell. The first sample/hold switch and the second sample/hold switch are turned-off, during an on period of the third sample/hold switch, a voltage sampled in the first sampling capacitor may be held as the first output voltage by the first holding capacitor, and a voltage sampled in the second sampling capacitor may be held as the second output voltage by the second holding capacitor.

The third sample/hold switch is turned off during a period while a positive electrode voltage of the first battery cell is sampled by the first sampling capacitor and the second sampling capacitor.

The switching unit may include a first connection switch coupled between the first output voltage and the positive input terminal; a second connection switch coupled between the first output voltage and the negative input terminal; a third connection switch coupled between the second output voltage and the positive input terminal; and a fourth connection switch coupled between the second output voltage and the negative input terminal.

When the first output voltage is a voltage obtained by sampling a positive electrode voltage of a first battery cell among the battery cells, and the second output voltage is a voltage obtained by sampling a negative electrode voltage of the first battery cell, the first connection switch and the fourth connection switch may be turned-on, and the second connection switch and the third connection switch may be turned-off.

When the first output voltage is a voltage obtained by sampling a negative electrode voltage of a first battery cell among the battery cells, and the second output voltage is a voltage obtained by sampling a positive electrode voltage of the first battery cell, the first connection switch and the fourth connection switch may be turned-off, and the second connection switch and the third connection switch may be turned-on.

A battery management system for managing a battery pack including a plurality of battery cells connected to each other in series according to an exemplary embodiment, includes: a voltage measuring device including a first node coupled to one of positive electrodes and negative electrodes of one battery cell among the battery cells, and a second node coupled to a remaining one of the positive electrodes and the negative electrodes of the battery cell, and configured to sample a voltage of the first node and a voltage of the second node to measure the battery cell voltage according to a difference between the sampled voltage of the first node and the sampled voltage of the second node; and a controller configured to receive the battery cell voltage from the voltage measuring apparatus to control charge and discharge of the battery pack.

The voltage measuring apparatus of the battery management system may include a sample/hold amplifier configured to sampling and hold the voltage of the first node to generate the first output voltage and to sample and hold the voltage of the second node to generate the second output voltage; and a switching unit configured to control connection between third and fourth nodes and the first and second output voltages according to a polarity of the battery cell to which the first node and the second node are coupled. The sample/hold amplifier may electrically insulate the switching unit from the battery cells.

The voltage measuring apparatus may further include a differential voltage converter including a positive input terminal coupled to the third node and a negative input terminal coupled to the fourth node, and configured to generate the battery cell voltage according to a voltage difference between the positive input terminal and the negative input terminal.

The sample/hold amplifier may include a first sampling capacitor including one electrode coupled to the first node; a second sampling capacitor including one electrode coupled to the second node; an operational amplifier including a first input terminal coupled to another electrode of the first sampling capacitor, a second input terminal coupled to another electrode of the second sampling capacitor, a first output node to which the first output voltage is applied, and a second output node to which the second output voltage is applied; a first holding capacitor and a first sample/hold switch coupled between the first input terminal and the first output node; a second holding capacitor and a second sample/hold switch coupled between the second input terminal and the second output node; and a third sample/hold switch coupled between the first node and the second node.

When the first node is coupled to a positive electrode of the battery cell, and the second node is coupled to a negative electrode of the battery cell, the first sampling capacitor samples a positive electrode voltage of the battery cell, and the second sampling capacitor samples a negative electrode voltage of the battery cell during an on period of the first sample/hold switch and the second sample/hold switch. The first sample/hold switch and the second sample/hold switch are turned-off, during an on period of the third sample/hold switch. A voltage sampled in the first sampling capacitor may be held as the first output voltage by the first holding capacitor, and a voltage sampled in the second sampling capacitor may be held as the second output voltage by the second holding capacitor.

When the first node is coupled to a negative electrode of the first battery cell, the second node is coupled to a positive electrode of the first battery cell, the first sampling capacitor samples a negative electrode voltage of the battery cell, and the second sampling capacitor samples a positive electrode voltage of the battery cell during an on period of the first sample/hold switch and the second sample/hold switch. The first sample/hold switch and the second sample/hold switch are turn-off, during the third sample/hold switch. A voltage sampled in the first sampling capacitor may be held as the first output voltage by the first holding capacitor, and a voltage sampled in the second sampling capacitor may be held as the second output voltage by the second holding capacitor.

According to an exemplary embodiment, the size and the size of the voltage measuring apparatus can be reduced, and the battery management system including the voltage measuring apparatus is provided.

DETAILED DESCRIPTION OF THE EMBODIMENTS

In the following detailed description, only certain exemplary embodiments of the invention have been shown and described, simply by way of illustration. As those skilled in the art would realize, the described embodiments may be modified in various different ways, all without departing from the spirit or scope of the invention. Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising", will be understood to imply the inclusion of stated elements but not the exclusion of any other elements.

Hereinafter, a voltage measuring apparatus and a battery management system including the same according to an exemplary embodiment will be described with reference to the accompanying drawings.

Figure 1:
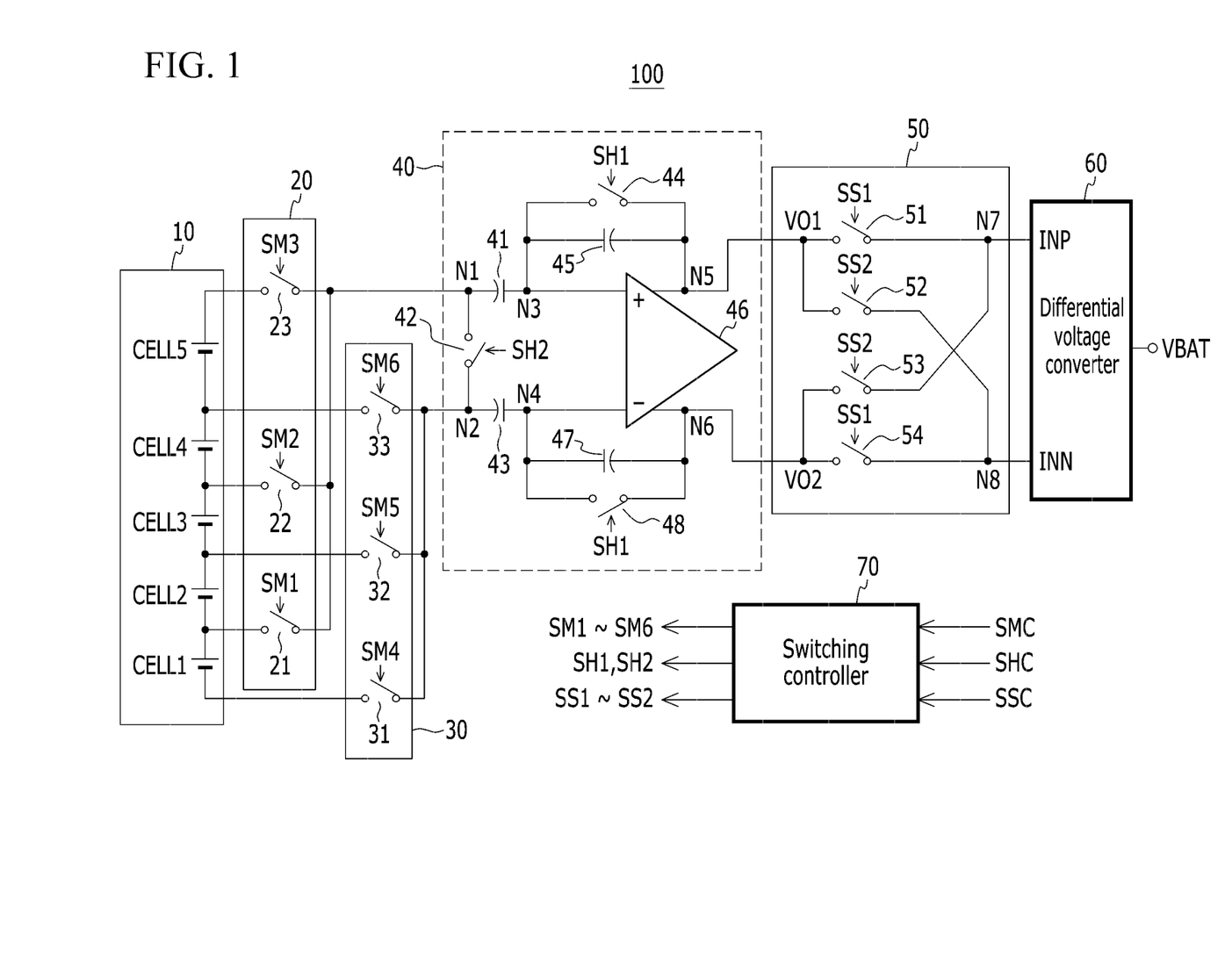
FIG. 1 is a circuit diagram illustrating a voltage measuring apparatus according to an exemplary embodiment.

FIG. 1 is a circuit diagram illustrating a voltage measuring apparatus according to an exemplary embodiment.

As shown in FIG. 1, the voltage measuring apparatus 100 is connected to a battery pack 10 and measures respective voltages of a plurality of battery cell CELL1 to CELL5.

The voltage measuring apparatus 100 includes a first multiplexer 20, a second multiplexer 30, a sample/hold amplifier 40, a switching unit 50, a differential voltage converter 60, and a switch controller 70.

The first multiplexer 20 and the second multiplexer 30 connect a battery cell among a plurality of battery cell CELL1 to CELL5 serving as a voltage measuring target to the sampling/hold amplifier 40.

The first multiplexer 20 includes switches 21 to 23 connected between a positive electrode or a negative electrode of a corresponding battery cell among a plurality of battery cell CELL1 to CELL5 and a first node N1 which is an input terminal of the sample/hold amplifier 40.

A first switch 21 performs a switching operation according to a first multiplex control signal SM1, and includes one terminal connected to a positive electrode of a first battery cell CELL1 and another terminal connected to the first node N1.

A second switch 22 performs a switching operation according to a second multiplex control signal SM2, and includes one terminal connected to a positive electrode of a third battery cell CELL3 and another terminal connected to the first node N1.

A third switch 23 performs a switching operation according to a third multiplex control signal SM3, and includes one terminal connected to a positive electrode of a fifth battery cell CELL5 and another terminal connected to the first node N1.

The second multiplexer 30 includes switches 31 to 33 connected between a negative electrode or a positive electrode of a corresponding battery cell among a plurality of battery cell CELL1 to CELL5 and a second node N2 which is an input terminal of the sample/hold amplifier 40.

A first switch 31 performs a switching operation according to a fourth multiplex control signal SM4, and includes one terminal connected to a negative electrode of the first battery cell CELL1 and another terminal connected to the second node N1.

A second switch 32 performs a switching operation according to a fifth multiplex control signal SM5, and includes one terminal connected to a negative electrode of the third battery cell CELL3 and a positive electrode of the second battery cell CELL2, and another terminal connected to the second node N1.

A third switch 33 performs a switching operation according to a fifth multiplex control signal SM5, and includes one terminal connected to a positive electrode of the fourth battery cell CELL4 and a negative electrode of the fifth battery cell CELL5, and another terminal connected to the second node N1.

For example, enable levels of the multiplex control signals SM1 to SM6 may be a high level, and disable levels thereof may be a low level.

When measuring a voltage of the first battery cell CELL1, the first and fourth control signals SM1 and SM4 are at a high level, and the first switch 21 of the first multiplexer 20 and the first switch 31 of the second multiplexer 30 are turned-on. Accordingly, the positive electrode of the first battery cell CELL1 is connected to the first node N1, and the negative electrode of the battery cell CELL1 is connected to the second node N2.

When measuring a voltage of the second battery cell CELL2, the first and fifth control signals SM1 and SM5 are at a high level, and the first switch 21 of the first multiplexer 20 and the second switch 32 of the second multiplexer 30 are turned-on. Accordingly, the negative electrode of the second battery cell CELL2 is connected to the first node N1, and the positive electrode of the battery cell CELL2 is connected to the second node N2.

When measuring a voltage of the third battery cell CELL3, the second and fifth control signals SM2 and SM5 are at a high level, and the second switch 22 of the first multiplexer 20 and the second switch 32 of the second multiplexer 30 are turned-on. Accordingly, the positive electrode of the third battery cell CELL3 is connected to the first node N1, and the negative electrode of the third battery cell CELL3 is connected to the second node N2.

When measuring a voltage of the fourth battery cell CELL4, the second and sixth control signals SM2 and SM6 are at a high level, and the second switch 22 of the first multiplexer 20 and the third switch 33 of the second multiplexer 30 are turned-on. Accordingly, the positive electrode of the fourth battery cell CELL4 is connected to the second node N2, and the negative electrode of the fourth battery cell CELL4 is connected to the first node N1.

When measuring a voltage of the fifth battery cell CELL5, the third and sixth control signals SM3 and SM6 are at a high level, and the third switch 23 of the first multiplexer 20 and the third switch 33 of the second multiplexer 30 are turned-on. Accordingly, the positive electrode of the fifth battery cell CELL5 is connected to the first node N2, and the negative electrode of the fifth battery cell CELL5 is connected to the second node N1.

In this manner, respective nodes of battery cells CELL1, CELL3, and CELL5 among a plurality of battery cell CELL1 to CELL5 are connected to the first node N1, and respective negative electrodes of the battery cells CELL1, CELL3, and CELL5 are connected to the second node N2. Respective positive electrodes of remaining battery cell CELL2 and CELL4 are connected to the second node N2, and respective negative electrodes of the remaining battery cell CELL2 and CELL4 are connected to the first node N1.

When measuring battery cell voltages of the battery cells CELL1, CELL3, and CELL5, a voltage supplied between a first node N1 and a second node N2 of the sample/hold amplifier 40 has a positive polarity. When measuring battery cell voltages of the battery cells CELL2 and CELL4, a voltage supplied between a first node N1 and a second node N2 of the sample/hold amplifier 40 has a negative polarity.

The sample/hold amplifier 40 includes a first sampling capacitor 41, a second sampling capacitor 43, a first sample/hold switch 44, a first holding capacitor 45, an operational amplifier 46, a second holding capacitor 47, a second sample/hold switch 48, and a third sample/hold switch 42.

The sample/hold amplifier 40 electrically insulates the switching unit 50 from the battery pack 10, and samples and holds a positive electrode voltage and a negative electrode voltage of a connected battery cell among the battery cells CELL1 to CELL5 and transfers the sampled/held voltages to a next stage. A voltage held in the sample/hold amplifier 40 is a low voltage.

Since the switching unit 50 is connected to a next stage of the sample/hold amplifier 40, it is not necessary that switches of the switching unit 50 are a high voltage switch.

The first sampling capacitor 41 includes one electrode connected to the first node N1 and another electrode connected to a third node N3. The first holding capacitor 45 includes one electrode connected to third node N3 and another electrode connected to a first output node N5. The first sample/hold switch 44 is switched according to the first sample/holding control signal SH1, and includes one terminal connected to the third node N3 and another terminal connected to the first output node N5.

The second sampling capacitor 43 includes one electrode connected to the second node N2 and another electrode connected to a fourth node N4. The second holding capacitor 47 includes one electrode connected to the fourth node N4 and another electrode connected to a second output node N6. The second sample/hold switch 48 is switched according to the first sample/holding control signal SH1, and includes one terminal connected to the first output node N5 and another terminal connected to the second output node N6.

The third sample/hold switch 42 is switched according to the second sampling/holding control signal SH2, and is connected between the first node N1 and the second node N2. When the third sample/hold switch 42 is turned-on, a voltage charged in the first sampling capacitor 41 is transferred to the first holding capacitor 45, and a voltage charged in the second sampling capacitor 43 is transferred to the second holding capacitor 47.

The operational amplifier 46 includes a first input terminal (+) connected to the third node N3 and a second input terminal (−) connected to the fourth node N4. When the first sample/hold switch 44 and the second sample/hold switch 48 are turned-off, and the third sample/hold switch 42 are turned-on, an input of the first input terminal (+) and an input of the second input terminal (−) are output to the first output node N5 and the second output node N6, respectively.

A voltage of the first output node N5 and a voltage of the second output node N6 refer to the first output voltage VO1 and the second output voltage VO2, respectively. The first output voltage VO1 is held by the first holding capacitor 45, and the second output voltage VO2 is held by the second holding capacitor 47.

The switching unit 50 receives the first output voltage VO1 and the second output voltage VO2, and controls respective transfer paths of the first output voltage VO1 and the second output voltage VO2 according to a polarity of a difference between the first output voltage VO1 and the second output voltage VO2. The switching unit 50 includes the first to fourth connection switches 51 to 54.

The first connection switch 51 and the fourth connection switch 54 perform a switching operation according to the first connection signal SS1, and the second connection switch 52 and the third connection switch 53 perform a switching operation according to the second connection signal SS2.

For example, when the first output voltage VO1 is greater than the second output voltage VO2, the difference voltage has a positive polarity, the first and fourth connection switch 51 and 54 are turned-on, and the second and third connection switch 52 and 53 are turned-off. Accordingly, the first output voltage VO1 is connected to a node N7, and the second output voltage VO2 is connected to a node N8.

On the contrary, when the first output voltage VO1 is less than the second output voltage VO2, the voltage difference has a negative polarity, the second and the third connection switches 52 and 53 are turned-on, and the first and the fourth connection switches 51 and 54 are turned-off. Accordingly, the first output voltage VO1 is connected to the node N8, and the second output voltage VO2 is connected to the node N7.

The differential voltage converter 60 receives respective voltages of the node N7 and the node N8, and generates a battery cell voltage VBAT according to a voltage obtained by subtracting the voltage of the node N8 from the voltage of an input voltage of the node N7. For example, a positive input terminal INP of the differential voltage converter 60 is connected to the node N7, and a negative input terminal INN of the differential voltage converter 60 is connected to the node N8. The differential voltage converter 60 amplifies a voltage obtained by subtracting the voltage of the negative input terminal INN from the voltage of the positive input terminal INP with a predetermined gain to generate the battery cell voltage VBAT.

The switching controller 70 receives switching control signals SMC, SHC, and SSC from the outside, and generates a plurality of multiplex control signals SM1 to SM6, first and second sampling/holding control signal SH1 and SH2, and first and second connection signals SS1 and SS2.

Hereinafter, referring to FIG. 2, an operation of the voltage measuring apparatus according to an exemplary embodiment will be described with reference to FIG. 2.

Figure 2:
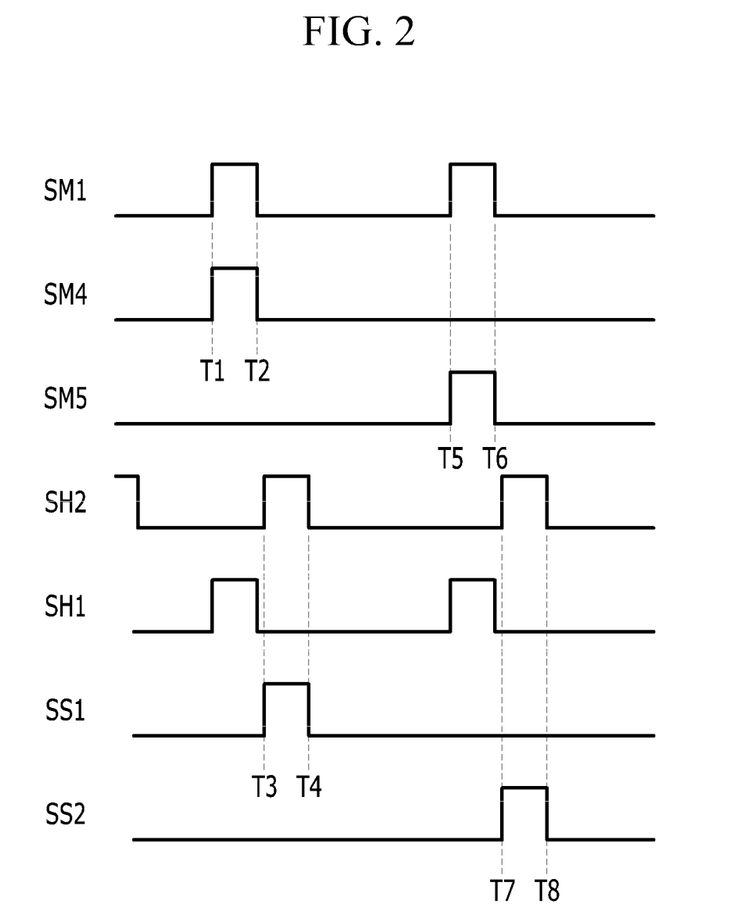
FIG. 2 is a waveform diagram illustrating a plurality of multiplex control signals, a plurality of sample/holding control signals, and a plurality of connection signals according to an exemplary embodiment.

FIG. 2 is a waveform diagram illustrating a plurality of multiplex control signals, a plurality of sampling/holding control signals, and a plurality of connection signals according to an exemplary embodiment.

Hereinafter, enable levels of the multiplex control signal, the sampling/holding control signal, and the connection signal are set at a high level, and disable levels thereof are set at a low level. That is, when the multiplex control signal, the sampling/holding control signal, and the connection signal are at the high level, a corresponding switch is turned-on. When the multiplex control signal, the sampling/holding control signal and the connection signal are at the low level, the corresponding switch is turned-off.

Further, the waveform diagram illustrated in FIG. 2 is an example of describing the voltage measuring apparatus 100, but an exemplary embodiment is not limited thereto.

First, the following is a description of measuring a voltage of a first battery cell CELL1.

A first multiplex control signal SM1 and a fourth multiplex control signal SM4 transition to a high level at a time point T1. Accordingly, a first switch 21 and a first switch 31 are turned-on, a positive electrode of the first battery cell CELL1 is connected to the first node N1, and a negative electrode of the first battery cell CELL1 is connected to the second N2. In this case, at a time point T1, the first sampling/holding control signal SH1 is at a high level, and the first sample/hold switch 44 and the second sample/hold switch 48 are turned-on.

Accordingly, a first sampling capacitor 41 is charged with a positive electrode voltage of the first battery cell CELL1, and the second sampling capacitor 43 is charged with a negative electrode voltage of the first battery cell CELL1.

At a time point T2, the first multiplex control signal SM1 and the fourth multiplex control signal SM4 transition to a low level. Accordingly, the first switch 21 and the first switch 31 are turned-off, and connection between the first battery cell CELL1 and the first node N1 and the second node N2 is blocked. Further, the first sampling/holding control signal SH1 transitions to a low level in synchronization with the time point T2, the first sample/hold switch 44 and the second sample/hold switch 48 are turned-off.

During a period T1~T2, the first sampling capacitor 41 is charged with a positive electrode voltage of the first battery cell CELL1, the second sampling capacitor 43 is charged with a negative electrode voltage of the firs battery cell CELL1, and a voltage sampled in the first sampling capacitor 41 and a voltage sampled in the second sampling capacitor 43 are significantly less than an actual voltage of the first battery cell CELL1. In this case, the operational amplifier 46 serves as a voltage follower.

At a time point T3, the second sampling/holding control signal SH2 and the first connection signal SS1 transition to a high level, the third sample/hold switch 42, and the first connection switch 51 and the fourth connection switch 54 are turned-on.

After the time point T3, the first holding capacitor 45 is connected between the first input terminal (+) of the operational amplifier 46 and the first output node N5, and the second holding capacitor 47 is connected between the second input terminal (−) of the operational amplifier 46 and the second output node N6. Accordingly, after the time point T3, the operational amplifier 46 amplifies a difference between input voltages.

A voltage sampled by the first sampling capacitor 41 is input to the first input terminal (+) of the operational amplifier 46, and a voltage sampled by the second sampling capacitor 43 is input to the second input terminal (−) of the operational amplifier 46. Accordingly, the operational amplifier 46 outputs an input voltage of the first input terminal (+) to the first output node N5, and the first output voltage VO1 is held by the first holding capacitor 45. The operational amplifier 46 outputs an input voltage of the second input terminal (−) to the second output N6, and the second output voltage VO2 is held by the second holding capacitor 47.

At a time point T4, the first connection signal SS1 transitions to a low level so that the first connection switch 51 and the fourth connection switch 54 are turned-off.

During a period T3~T4, the node N7 is connected to the first output node N5, and the node N8 is connected to the second output node N6. Accordingly, the differential voltage converter 60 generates a battery cell voltage VBAT according to a difference between a voltage obtained by sampling a positive electrode voltage of the first battery cell CELL1 and a voltage obtained by sampling a negative electrode voltage of the first battery cell CELL1.

The following is a description of measuring a voltage of the second battery cell CELL2.

At a time point T5, the first multiplex control signal SM1 and the fifth multiplex control signal SM5 transition to a high level. Accordingly, the first switch 21 and the second switch 32 are turned-on, a positive electrode of the second battery cell CELL2 is connected to the second node N2, and a negative electrode of the second battery cell CELL2 is connected to the first node N1. In this case, the first sampling/holding control signal SH1 is at a high level at the time point T5, and the first sample/hold switch 44 and the second sample/hold switch 48 are turned-on.

Accordingly, the second sampling capacitor 43 is charged with a positive electrode voltage of the second battery cell CELL2, and the first sampling capacitor 41 is charged with a negative electrode voltage of the second battery cell CELL2.

At a time point T6, the first multiplex control signal SM1 and the fifth multiplex control signal SM5 transition to a low level. Then, the first switch 21 and the second switch 32 are turned-off, and connection between the second battery cell CELL2 and the first node N1 and the second node N2 is blocked. Further, the first sampling/holding control signal SH1 transitions to a low level in synchronization with the time point T6, and the first sample/hold switch 44 and the second sample/hold switch 48 is turned-off.

During a period T5~T6, the first sampling capacitor 41 is charged with a negative electrode voltage of the second battery cell CELL2, the second sampling capacitor 43 is charged with a positive electrode voltage of the second battery cell CELL2, and a voltage sampled in the first sampling capacitor 41 and a voltage sampled in the second sampling capacitor 43 are significantly less than an actual voltage of the second battery cell CELL2. In this case, the operational amplifier 46 serves as a voltage follower.

At a time point T7, the second sampling/holding control signal SH2 and the second connection signal SS2 transition to a high level, the third sample/hold switch 42, and the second connection switch 52, and the third connection switch 53 are turned-on.

After the time point T7, the operational amplifier 46 amplifies a difference between input voltages. A voltage sampled by the first sampling capacitor 41 is input to the first input terminal (+) of the operational amplifier 46, and a voltage sampled by the second sampling capacitor 43 is input to the second input terminal (−) of the operational amplifier 46. Accordingly, the operational amplifier 46 outputs an input voltage of the first input terminal (+) to the first output node N5, and outputs an input voltage of the second input terminal (−) to the second output node N6.

At a time point T8, the second connection signal SS2 transitions to a low level so that the second connection switch 52 and the third connection switch 53 are turned-off.

During a period T7~T8, the node N7 is connected to the second output node N6, and the node N8 is connected to the first output node N5. Accordingly, the differential voltage converter 60 generates a battery cell voltage VBAT according to a difference between a voltage obtained by sampling a positive electrode voltage of the second battery cell CELL2 and a voltage obtained by sampling a negative electrode voltage of the second battery cell CELL2.

BY repeating the foregoing operation, cell voltages of battery cells CELL1 to CELL5 are sequentially measured, and battery cell voltage VBAT is sequentially generated. By the operation of the switching unit 50, the voltage of the positive input terminal INP is controlled to always be greater than a voltage of the negative input terminal INN.

Hereinafter, a battery management system according to an exemplary embodiment will be described with reference to FIG. 3.

Figure 3:
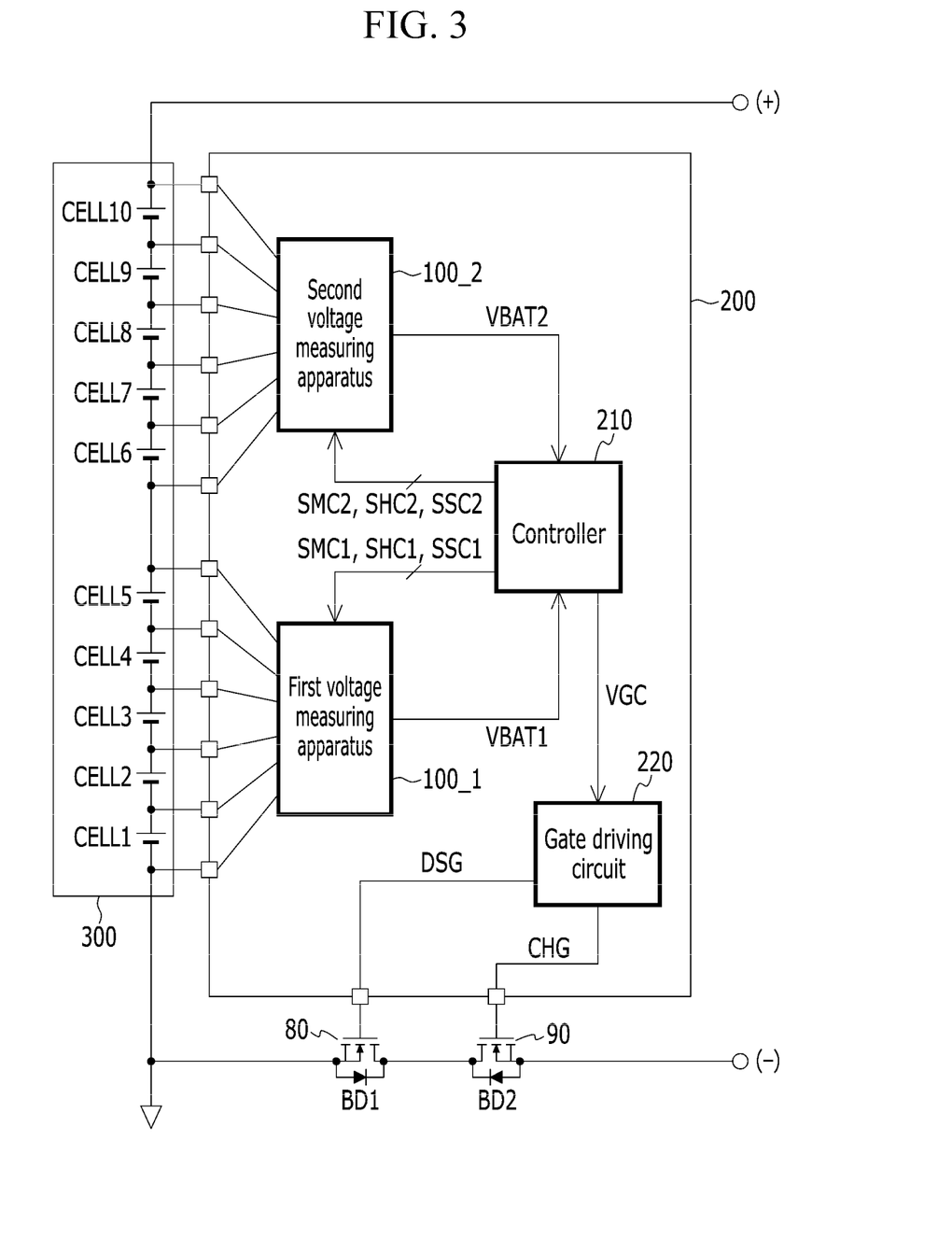
FIG. 3 is a diagram illustrating a battery management system including a voltage measuring apparatus according to an exemplary embodiment.

FIG. 3 is a diagram illustrating a battery management system including a voltage measuring apparatus according to an exemplary embodiment.

As shown in FIG. 3, the battery management system 200 is connected to ten battery cells CELL1 to CELL10. In FIG. 3, a battery pack 300 includes ten battery cells, but the number of battery cells is illustrative purpose only, but an exemplary embodiment not limited thereto.

One terminal of the battery 300 is connected to a positive electrode (+), and another terminal of the battery pack 300 is connected to a ground and a negative electrode (−). A discharge switch 80 and a charge switch 90 are serially connected between the ground and the negative electrode (−). The discharge switch 80 performs a switching operation according to a discharge control signal DSG, and the charge switch 90 performs a switching operation according to a charge control signal CHG. A first body diode BD1 is provided between a drain and a source of the discharge switch 80, and a second body diode BD2 is provided between a drain and a source of the charge switch 90.

A charger (not shown) or a load (not shown) may be connected between a positive electrode (+) and a negative electrode (−).

The battery management system 200 includes a first voltage measuring apparatus 100_1 and a second voltage measuring apparatus 100_2 which measure cell voltages of the battery cells CELL1 to CELL5. However, an embodiment illustrated in FIG. 3 is an example of describing the exemplary embodiment, but the exemplary embodiment is not limited thereto.

For example, one voltage measuring apparatus may be designed to measure ten battery cells. That is, it is sufficient if one of the first multiplexer 20 and the second multiplexer 30 in FIG. 1 includes eleven switches.

As shown in FIG. 3, first to fifth battery cells CELL1 to CELL5 are connected to the first voltage measuring apparatus 100_1, and the sixth to tenth battery cell CELL6 to CELL10 are connected to the second voltage measuring apparatus 100_2.

First, a controller 210 being one constituent element of the battery management system 200 generates and transfers switching control signals SMC1, SMC2, SHC1, SHC2, SSC1, and SSC2 to the first voltage measuring apparatus 100_1 and the second voltage measuring apparatus 100_2.

The first voltage measuring apparatus 100_1 measures respective voltages of a plurality of battery cells CELL1 to CELL5 according to switching control signals SMC1, SHC1, and SSC1 to generate the first battery cell voltage VBAT1. The first battery cell voltage VBAT1 is transmitted to the controller 210.

The second voltage measuring apparatus 100_2 measures respective voltages of a plurality of battery cells CELL6 to CELL10 according to switching control signals SMC2, SHC2, and SSC2 to generate the second battery cell voltage VBAT2. The second battery cell voltage VBAT2 is transferred to the controller 210.

Configurations and operations of the first voltage measuring apparatus 100_1 and the second voltage measuring apparatus 100_2 are the same as those illustrated with reference to FIGS. 1 and 2, and thus a detailed description thereof is omitted.

The controller 210 detects states of the battery cells CELL1 to CELL10 according to the first and second battery cell voltages VBAT1 and VBAT2 to control charging and discharging operations. For example, the controller 210 generates a gate control signal VGC for controlling the charging and discharging operations.

A gate driving circuit 220 being one constituent element of the battery management system 200 generates a discharging control signal DSG and a charging control signal CHG according to the gate control signal VGC.

In this manner, the voltage measuring apparatus and the battery management system including the same according to an exemplary embodiment may measure voltages of battery cells without using a high voltage switch to control charging and discharging of the battery pack.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS voltage measuring apparatus 100, first multiplexer 20
second multiplexer 30, sample/hold amplifier 40
switching unit 50, differential voltage converter 60, switch controller 70
first sampling capacitor 41, third sample/hold switch 42
second sampling capacitor 43, first sample/hold switch 44
first holding capacitor 45, operational amplifier 46,
second holding capacitor 47, second sample/hold switch 44
switch 21 to 23, 31 to 33, first to fourth connection switch 51 to 54
battery management system 200, controller 210
gate driving circuit 220, discharge switch 80, charge switch 90

What is claimed is:

1. A voltage measuring apparatus coupled to a plurality of battery cells coupled to each other in series to measure respective voltages of the battery cells, the voltage measuring apparatus comprising:
    a sample/hold amplifier configured to sample and hold positive electrode and negative electrode voltages of the battery cells to generate first and second output voltages;
    a differential voltage converter configured to generate a battery cell voltage according to a voltage difference between a positive input terminal and a negative input terminal; and
    a switching unit configured to control switching of first, second, third and fourth connection switches coupled between one of the first and second output voltages and one of the positive input terminal and the negative input terminal so that a polarity of the voltage difference is constant,
    wherein the sample/hold amplifier electrically insulates the switching unit from the battery cells.

2. The voltage measuring apparatus of claim 1, wherein the sample/hold amplifier,
    is configured to hold an input of a first input terminal in a first output node to generate the first output voltage and to hold an input of a second input terminal in a second output node to generate the second output voltage, wherein the input of the first input terminal is a voltage obtained by sampling a voltage at one of a positive electrode and a negative electrode of a first battery cell among the battery cells, and the input of the second input terminal is a voltage obtained by sampling a voltage at a remaining one of the positive electrode and the negative electrode of the first battery cell.

3. The voltage measuring apparatus of claim 2, wherein:
the switching unit,
when the input of the first input terminal is a voltage obtained by sampling a positive electrode voltage of the first battery cell, and the input of the second input terminal is a voltage obtained by sampling a negative electrode voltage of the first battery cell,
is configured to couple the positive input terminal to the first output node and to couple the negative input terminal to the second output node.

4. The voltage measuring apparatus of claim 2, wherein:
the switching unit,
when the input of the first input terminal is a voltage by sampling a negative electrode of the first battery cell, and the input of the second input terminal is a voltage obtained by sampling a positive electrode voltage of the first battery cell,
is configured to couple the positive input terminal to the second output node and to couple the negative input terminal to the first output node.

5. The voltage measuring apparatus of claim 2, further comprising:
a first multiplexer including a first switch coupled to the positive electrode of the first battery cell; and
a second multiplexer including a second switch coupled to the negative electrode of the first battery cell.

6. The voltage measuring apparatus of claim 5, wherein the first switch is coupled to a negative electrode of a second battery cell of the battery cells close to the positive electrode of the first battery cell.

7. The voltage measuring apparatus of claim 5, wherein the second switch is coupled a positive electrode of a third battery cell of the battery cells close to the negative electrode of the first battery cell.

8. The voltage measuring apparatus of claim 1, wherein the sample/hold amplifier comprises:
a first sampling capacitor including one electrode coupled to the first node;
a second sampling capacitor including one electrode coupled to the second node;
an operational amplifier including a first input terminal coupled to another electrode of the first sampling capacitor, a second input terminal coupled to another electrode of the second sampling capacitor, a first output node to which the first output voltage is applied, and a second output node to which the second output voltage is applied;
a first holding capacitor and a first sample/hold switch coupled between the first input terminal and the first output node;
a second holding capacitor and a second sample/hold switch coupled between the second input terminal and the second output node; and
a third sample/hold switch coupled between the first node and the second node,
wherein the first node and the second node are coupled to a corresponding one of a positive electrode and a negative electrode of the first battery among the battery cells.

9. The voltage measuring apparatus of claim 8, wherein:
during a first period when the operational amplifier serves as a voltage follower,
voltages are sampled in the first sampling capacitor and the second sampling capacitor, respectively,
the operational amplifier amplifies a voltage difference between the first input terminal and the second input terminal after the first period.

10. The voltage measuring apparatus of claim 8, wherein:
when the first node is coupled to the positive electrode of the first battery cell, and the second node is coupled to the negative electrode of the first battery cell,
during an on period of the first sample/hold switch and the second sample/hold switch,
the first sampling capacitor samples a positive electrode voltage of the first battery cell, and the second sampling capacitor samples a negative electrode voltage of the first battery cell,
the first sample/hold switch and the second sample/hold switch are turned-off, during an on period of the third sample/hold switch,
a voltage sampled in the first sampling capacitor is held as the first output voltage by the first holding capacitor, and a voltage sampled in the second sampling capacitor is held as the second output voltage by the second holding capacitor.

11. The voltage measuring apparatus of claim 8, wherein:
when the first node is coupled to the negative electrode of the first battery cell, and the second node is coupled to the positive electrode of the first battery cell,
during an on period of the first sample/hold switch and the second sample/hold switch,
the first sampling capacitor samples a negative electrode voltage of the first battery cell, and the second sampling capacitor samples a positive electrode voltage of the first battery cell,
the first sample/hold switch and the second sample/hold switch are turned-off, during an on period of the third sample/hold switch,
a voltage sampled in the first sampling capacitor is held as the first output voltage by the first holding capacitor, and a voltage sampled in the second sampling capacitor is held as the second output voltage by the second holding capacitor.

12. The voltage measuring apparatus of claim 8, wherein the third sample/hold switch is turned off during a period while a positive electrode voltage of the first battery cell is sampled by the first sampling capacitor and the second sampling capacitor.

13. The voltage measuring apparatus of claim 1, wherein the switching unit comprises:
the first connection switch coupled between the first output voltage and the positive input terminal;
the second connection switch coupled between the first output voltage and the negative input terminal;
the third connection switch coupled between the second output voltage and the positive input terminal; and
the fourth connection switch coupled between the second output voltage and the negative input terminal.

14. The voltage measuring apparatus of claim 13, wherein:
when the first output voltage is a voltage obtained by sampling a positive electrode voltage of a first battery cell among the battery cells, and the second output voltage is a voltage obtained by sampling a negative electrode voltage of the first battery cell, the first connection switch and the fourth connection switch are turned-on, and the second connection switch and the third connection switch are turned-off.

15. The voltage measuring apparatus of claim 13, wherein:
when the first output voltage is a voltage obtained by sampling a negative electrode voltage of a first battery cell among the battery cells, and the second output voltage is a voltage obtained by sampling a positive electrode voltage of the first battery cell,
the first connection switch and the fourth connection switch are turned-off, and the second connection switch and the third connection switch are turned-on.

* * * * *